(12) United States Patent
Moslehi et al.

(10) Patent No.: US 9,870,937 B2
(45) Date of Patent: Jan. 16, 2018

(54) HIGH PRODUCTIVITY DEPOSITION REACTOR COMPRISING A GAS FLOW CHAMBER HAVING A TAPERED GAS FLOW SPACE

(75) Inventors: Mehrdad M. Moslehi, Los Altos, CA (US); Karl-Josef Kramer, San Jose, CA (US); Jay Ashjaee, Cupertino, CA (US); George D. Kamian, Scotts Valley, CA (US); David Mordo, Cupertino, CA (US); Takao Yonehara, Sunnyvale, CA (US)

(73) Assignee: OB Realty, LLC, Irvine, CA (US)

( * ) Notice: Subject to any disclaimer, the term of this patent is extended or adjusted under 35 U.S.C. 154(b) by 585 days.

(21) Appl. No.: 13/157,250

(22) Filed: Jun. 9, 2011

(65) Prior Publication Data

US 2012/0085278 A1 Apr. 12, 2012

Related U.S. Application Data

(60) Provisional application No. 61/353,042, filed on Jun. 9, 2010, provisional application No. 61/389,154, filed on Oct. 1, 2010.

(51) Int. Cl.
*C30B 25/14* (2006.01)
*H01L 21/677* (2006.01)
(Continued)

(52) U.S. Cl.
CPC .. *H01L 21/67754* (2013.01); *C23C 16/45585* (2013.01); *C23C 16/481* (2013.01);
(Continued)

(58) Field of Classification Search
CPC ......... C30B 25/00; C30B 25/02; C30B 25/14; C23C 14/00; C23C 14/22; C23C 14/54;
(Continued)

(56) References Cited

U.S. PATENT DOCUMENTS 3,816,166 A 6/1974 Eversteijn et al.
4,043,894 A 8/1977 Gibbs
(Continued)

FOREIGN PATENT DOCUMENTS

FR 2763964 A1 12/1998
GB 2426252 A 11/2006
(Continued)

OTHER PUBLICATIONS

PCT International Search Report and Written Opinion dated May 11, 2012 issued in PCT/US2011/039877.
(Continued)

*Primary Examiner* — Kenneth A Bratland, Jr.
(74) *Attorney, Agent, or Firm* — Howard IP Law Group

(57) ABSTRACT

High productivity thin film deposition methods and tools are provided wherein a thin film semiconductor material layer with a thickness in the range of less than 1 micron to 100 microns is deposited on a plurality of wafers in a reactor. The wafers are loaded on a batch susceptor and the batch susceptor is positioned in the reactor such that a tapered gas flow space is created between the susceptor and an interior wall of the reactor. Reactant gas is then directed into the tapered gas space and over each wafer thereby improving deposition uniformity across each wafer and from wafer to wafer.

8 Claims, 15 Drawing Sheets

(51) Int. Cl.

| | |
|---|---|
| *C23C 16/455* | (2006.01) |
| *C23C 16/48* | (2006.01) |
| *C23C 16/54* | (2006.01) |
| *H01L 21/67* | (2006.01) |
| *H01L 21/02* | (2006.01) |

(52) U.S. Cl.
CPC .......... *C23C 16/54* (2013.01); *H01L 21/6719* (2013.01); *H01L 21/67757* (2013.01); *H01L 21/0262* (2013.01); *H01L 21/02532* (2013.01)

(58) Field of Classification Search
CPC ....... C23C 16/00; C23C 16/44; C23C 16/455; C23C 16/45585; C23C 16/481; C23C 16/54; C23D 16/00; C23D 16/44; C23D 16/455; H01L 21/67754; H01L 21/6719; H01L 21/67757; H01L 21/02532; H01L 21/0262
USPC ............. 117/84, 88, 102, 104; 118/726, 728
See application file for complete search history.

(56) References Cited

U.S. PATENT DOCUMENTS

| | | |
|---|---|---|
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,374,110 A | 2/1983 | Darnell |
| 4,409,423 A | 10/1983 | Holt |
| 4,427,839 A | 1/1984 | Hall |
| 4,430,519 A | 2/1984 | Young |
| 4,461,922 A | 7/1984 | Gay et al. |
| 4,468,283 A | 8/1984 | Ahmed |
| 4,479,847 A | 10/1984 | McCaldin et al. |
| 4,626,613 A | 12/1986 | Wenham et al. |
| 4,672,023 A | 6/1987 | Leung |
| 4,836,138 A * | 6/1989 | Robinson ............... C23C 16/481 118/500 |
| 4,922,277 A | 5/1990 | Carlson et al. |
| 4,936,251 A | 6/1990 | Yamazaki et al. |
| 5,024,953 A | 6/1991 | Uematsu et al. |
| 5,073,230 A | 12/1991 | Maracas et al. |
| 5,112,453 A | 5/1992 | Behr et al. |
| 5,208,068 A | 5/1993 | Davis |
| 5,248,621 A | 9/1993 | Sano |
| 5,252,132 A | 10/1993 | Oda et al. |
| 5,316,593 A | 5/1994 | Olson et al. |
| 5,348,618 A | 9/1994 | Canham et al. |
| 5,397,400 A | 3/1995 | Matsuno et al. |
| 5,458,755 A | 10/1995 | Fujiyama et al. |
| 5,459,099 A | 10/1995 | Hsu |
| 5,494,832 A | 2/1996 | Lehmann et al. |
| 5,538,564 A | 7/1996 | Kaschmitter |
| 5,567,242 A | 10/1996 | Soderberg et al. |
| 5,616,185 A | 4/1997 | Kukulka |
| 5,645,684 A | 7/1997 | Keller |
| 5,660,680 A | 8/1997 | Keller |
| 5,681,392 A | 10/1997 | Swain |
| 5,704,992 A | 1/1998 | Willeke et al. |
| 5,882,988 A | 3/1999 | Haberem et al. |
| 5,899,360 A | 5/1999 | Mack et al. |
| 5,928,438 A | 7/1999 | Salami |
| 5,994,640 A | 11/1999 | Bansemir et al. |
| 6,058,945 A | 5/2000 | Fujiyama et al. |
| 6,091,021 A | 7/2000 | Ruby |
| 6,093,253 A * | 7/2000 | Lofgren ............... C23C 16/45504 117/104 |
| 6,096,229 A | 8/2000 | Shahid |
| 6,114,046 A | 9/2000 | Hanoka |
| 6,127,623 A | 10/2000 | Nakamura et al. |
| 6,132,518 A | 10/2000 | Milinkovic et al. |
| 6,143,629 A | 11/2000 | Sato |
| 6,204,443 B1 | 3/2001 | Kiso et al. |
| 6,225,193 B1 | 5/2001 | Simpson et al. |
| 6,294,725 B1 | 9/2001 | Hirschberg et al. |
| 6,331,208 B1 | 12/2001 | Nishida et al. |
| 6,399,143 B1 | 6/2002 | Sun |
| 6,416,647 B1 | 7/2002 | Dordi et al. |
| 6,428,620 B1 | 8/2002 | Yamagata et al. |
| 6,429,037 B1 | 8/2002 | Wenham et al. |
| 6,441,297 B1 | 8/2002 | Keller et al. |
| 6,461,932 B1 | 8/2002 | Wang |
| 6,448,155 B1 | 9/2002 | Iwasaki et al. |
| 6,524,880 B2 | 2/2003 | Moon et al. |
| 6,534,336 B1 | 3/2003 | Iwane |
| 6,551,908 B2 | 4/2003 | Ukiyo et al. |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 | 11/2003 | Brendel |
| 6,649,485 B2 | 11/2003 | Solanki et al. |
| 6,653,722 B2 | 11/2003 | Blalock |
| 6,664,169 B1 | 12/2003 | Iwasaki et al. |
| 6,756,289 B1 | 6/2004 | Nakagawa et al. |
| 6,818,104 B2 | 11/2004 | Iwasaki et al. |
| 6,843,892 B1 * | 1/2005 | McLeod ............... C23C 14/50 118/500 |
| 6,875,279 B2 * | 4/2005 | Chu ............... C23C 16/4412 117/200 |
| 6,881,644 B2 | 4/2005 | Malik et al. |
| 6,946,052 B2 | 9/2005 | Yanagita et al. |
| 6,964,732 B2 | 11/2005 | Solanki |
| 7,014,748 B2 | 3/2006 | Matsumura et al. |
| 7,022,585 B2 | 4/2006 | Solanki et al. |
| 7,026,237 B2 | 4/2006 | Lamb |
| 7,147,714 B2 | 12/2006 | Naito et al. |
| 7,309,658 B2 | 12/2007 | Lazovsky et al. |
| 7,312,440 B2 | 12/2007 | Degertekin et al. |
| 7,368,756 B2 | 5/2008 | Bruhns et al. |
| 7,402,523 B2 | 7/2008 | Nishimura |
| 7,648,927 B2 | 1/2010 | Singh et al. |
| 7,682,843 B2 | 3/2010 | Moriya et al. |
| 8,656,860 B2 | 2/2014 | Kamian et al. |
| 2002/0066409 A1 | 6/2002 | Brun |
| 2002/0079290 A1 | 6/2002 | Holdermann |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0017712 A1 | 1/2003 | Brendel |
| 2003/0039843 A1 | 2/2003 | Johnson |
| 2003/0124761 A1 | 7/2003 | Baert |
| 2004/0028875 A1 | 2/2004 | Van Rijn |
| 2004/0173790 A1 | 9/2004 | Yeo |
| 2004/0175893 A1 | 9/2004 | Vatus et al. |
| 2004/0192044 A1 | 9/2004 | Degertekin et al. |
| 2004/0235406 A1 | 11/2004 | Duescher |
| 2004/0259335 A1 | 12/2004 | Narayanan |
| 2004/0265587 A1 | 12/2004 | Koyanagi |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0177988 A1 | 8/2006 | Shea et al. |
| 2006/0196536 A1 | 9/2006 | Fujioka |
| 2006/0216416 A1 | 9/2006 | Sumakeris |
| 2006/0231031 A1 | 10/2006 | Dings et al. |
| 2006/0252243 A1 | 11/2006 | Kishimoto et al. |
| 2006/0266916 A1 | 11/2006 | Miller et al. |

(56) References Cited

U.S. PATENT DOCUMENTS

| | | |
|---|---|---|
| 2006/0283495 A1 | 12/2006 | Gibson |
| 2006/0286775 A1 | 12/2006 | Singh et al. |
| 2007/0077770 A1 | 4/2007 | Wang et al. |
| 2007/0082499 A1 | 4/2007 | Jung et al. |
| 2008/0047601 A1 | 2/2008 | Nag et al. |
| 2008/0128641 A1 | 6/2008 | Henley et al. |
| 2008/0157283 A1 | 7/2008 | Moslehi |
| 2008/0210294 A1 | 9/2008 | Moslehi |
| 2008/0241384 A1 | 10/2008 | Jeong |
| 2008/0264477 A1 | 10/2008 | Moslehi |
| 2008/0289684 A1 | 11/2008 | Moslehi |
| 2008/0295887 A1 | 12/2008 | Moslehi |
| 2009/0042320 A1 | 2/2009 | Wang et al. |
| 2009/0107545 A1 | 4/2009 | Moslehi |
| 2009/0217877 A1 | 9/2009 | Lopez |
| 2009/0229519 A1* | 9/2009 | Saitoh .................. C23C 16/325 118/722 |
| 2009/0238972 A1 | 9/2009 | Clark et al. |
| 2009/0301549 A1 | 12/2009 | Moslehi |
| 2010/0022074 A1 | 1/2010 | Wang et al. |
| 2010/0116316 A1 | 5/2010 | Moslehi et al. |
| 2010/0144066 A1 | 6/2010 | Stephens et al. |
| 2010/0144080 A1 | 6/2010 | Ong |
| 2010/0148318 A1 | 6/2010 | Wang et al. |
| 2010/0148319 A1 | 6/2010 | Wang et al. |
| 2010/0154998 A1 | 6/2010 | Ong |
| 2010/0175752 A1 | 7/2010 | Wang et al. |
| 2010/0203711 A1 | 8/2010 | Wang et al. |
| 2010/0263587 A1 | 10/2010 | Sivaramakrishnan et al. |
| 2010/0267186 A1 | 10/2010 | Wang et al. |
| 2010/0267245 A1 | 10/2010 | Kamian et al. |
| 2010/0279494 A1 | 11/2010 | Wang et al. |
| 2010/0294333 A1 | 11/2010 | Wang et al. |
| 2010/0294356 A1 | 11/2010 | Parikh et al. |
| 2010/0300518 A1 | 12/2010 | Moslehi et al. |
| 2010/0304521 A1 | 12/2010 | Seutter et al. |
| 2010/0304522 A1 | 12/2010 | Rana et al. |
| 2011/0014742 A1 | 1/2011 | Parikh et al. |
| 2011/0030610 A1 | 2/2011 | Kamian et al. |
| 2012/0192789 A1 | 8/2012 | Kramer et al. |

FOREIGN PATENT DOCUMENTS

| | | |
|---|---|---|
| JP | S55-110030 A | 8/1980 |
| JP | 06-151339 A | 5/1994 |
| JP | 06-260670 A | 9/1994 |
| WO | PCT/EP1999/008573 | 5/2000 |
| WO | WO/2010/120850 | 10/2010 |
| WO | WO/2011/156657 | 12/2011 |
| WO | WO/2012/099700 | 7/2012 |

OTHER PUBLICATIONS

PCT International Preliminary Report on Patentability dated Dec. 10, 2012 issued in PCT/US2011/039877.

EP Extended Search Report dated Apr. 9, 2014 issued in EP 11793204.6.

Alvin D. Compaan, Photovoltaics: Clean Power for the 21st Century, Solar Energy Materials & Solar Cells, 2006, pp. 2170-2180, vol. 90, Elsevier B.V.

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE. (2006).

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342, (1977).

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) the Solar Energy Industry Association, (2006).

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, the Japan Journal of Applied Physics, 2001, pp. 4431-4439, vol. 40, Part 1, No. 7, The Japan Society of Applied Physics, Japan.

(56) References Cited

OTHER PUBLICATIONS

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

HIGH PRODUCTIVITY DEPOSITION REACTOR COMPRISING A GAS FLOW CHAMBER HAVING A TAPERED GAS FLOW SPACE

CROSS-REFERENCE TO RELATED APPLICATIONS

This application claims priority to U.S. Provisional Patent Application Ser. No. 61/353,042 filed Jun. 9, 2010, which is hereby incorporated by reference in its entirety.

This application also claims priority to U.S. Provisional Patent Application Ser. No. 61/389,154 filed Oct. 1, 2010, which is hereby incorporated by reference in its entirety.

FIELD

The present disclosure relates to epitaxial semiconductor deposition or growth. More particularly, the present disclosure relates tools enabling the epitaxial deposition (also called growth) of monocrystalline silicon or other semiconducting materials, including but not limited to any binary and ternary monocrystalline alloys of silicon, germanium, carbon, as well as other compound semiconductors such as gallium arsenide.

BACKGROUND

Currently, crystalline silicon has the largest market share in the photovoltaics (PV) industry, accounting for over 85% of the overall PV market share. The relatively high efficiencies associated with crystalline solar cells compared to most thin-film technologies, combined with the abundance as well as the environmentally benign and non-toxic nature of the material, garner appeal for continued use and advancement. Going to thinner crystalline silicon solar cells is understood to be one of the most potent ways to reduce PV manufacturing cost and the resulting Levelized Cost of Electricity (LCOE) because of the relatively high material cost of crystalline silicon wafers used in solar cells as a fraction of the total PV module cost (being on the order of 50% of the total PV module cost). And while deposition of epitaxial silicon film has been in use in the semiconductor industry (for applications such as bipolar chips and smart power devices), the high-productivity production of epitaxial crystalline silicon layers, including the production of monocrystalline silicon utilizing a single or double sided epitaxial deposition process, for use in solar cells or other applications at high production volumes and at a low cost has posed many challenges.

In the monocrystalline silicon epitaxy (epi) process, the film is deposited using a mixture of a silicon source gas, such as trichlorosilane (TCS), and/or silicon tetrachloride, and hydrogen at temperatures typically ranging between 1050° C. to 1250° C. Since deposition may happen on any exposed heated surface after the precursor gases are heated, it is advantageous to reduce the chamber area allocated to gas heating as much as possible. However, as the number of wafers in a conventional batch epi chamber increases so does the gas flow rate and the total heat rate. And one problem with increasing the heating area to accommodate the total heat rate for the higher gas flow rate is that this exposes a larger portion of the chamber to unwanted or parasitic deposition.

Furthermore, it is desirable to reduce the heated epi chamber areas (parasitic deposition regions) that are not covered by the target silicon substrates. The lower the ratio of uncovered to covered areas, the higher the effective source gas utilization and, potentially in most cases, the less the maintenance cost of susceptor cleaning. For this and other productivity related reasons, it is desirable to increase the number of wafers (or the wafer batch size) within a given deposition chamber. Similarly, and for other reasons such as thermal budget considerations and substantially increasing the manufacturing productivity, it may be desirable to grow epi films on both sides of the silicon substrate—such as applications where epi films that are deposited on both sides of a reusable crystalline semiconductor template are harvested and lifted off for solar cell fabrication at essentially double the harvesting rate of the single-sided templates.

One of the most promising technologies to achieve high solar cell efficiency at low silicon usage is the use of deposition of silicon as a thin film or foil between a fraction of 1 micron and 100 micron (µm) thickness on carrier wafers (templates). These templates have a designated weak release or separation (or cleavage) layer or layer system, which may be a porous semiconductor or specifically porous silicon layer, for the subsequent removal of said deposited thin semiconductor film or foil, which may require the use of a reinforcement layer to prevent mechanical breakage due to the thin ($\leq 100$ µm) and large ($\geq 100$ cm$^2$) substrate sizes of the thin film or foil. Thus, at least a portion of such porous layers are used as designated weak layers along which the deposited epi film may be lifted off from the substrate that it has been deposited on. However, current deposition equipment and processes are too costly and complex for large scale high volume deposition of epitaxial silicon thin film.

Another complication in high volume manufacturing of epi films is the amount of power required for each tool to heat the substrates and the gas to the necessary process temperature. Because the peak power required for each tool often reaches hundreds of kilowatts or even megawatts, individual or multi-tool start-ups can create huge electrical surges and sags in the plant if not managed.

Yet another concern for growing high quality epi film on a silicon substrate is the presence of moisture adsorbed or trapped in the substrate. This is particularly important if the substrate surface is made porous or contains several anodically etched porous layers, as is the case, for example, with thin monocrystalline silicon epitaxy films intended for subsequent lifting from the base material (reusable template) through the use of a sacrificial porous layer. This problem is confounded when epi films are deposited on bi-layer or multi-layer (or graded porosity) porous silicon structures.

Designing highly productive equipment requires a good understanding of the process requirements and reflecting those requirements in the equipment architecture. High manufacturing yield of thin film substrates requires a robust process and reliable deposition equipment. Thus, a highly productive, reliable, and efficient reactor is essential for the high-throughput production of low-cost, high-efficiency solar cells.

SUMMARY

Therefore a need has arisen for high productivity thin film deposition methods and systems. In accordance with the disclosed subject matter, high productivity thin film deposition methods are provided which substantially reduce or eliminate disadvantages and problems associated with previously developed thin film deposition methods.

According to one aspect of the disclosed subject matter, high productivity thin film deposition methods and tools are provided wherein a thin film semiconductor material layer with a thickness in the range of less than 1 micron to 100 microns is deposited on a plurality of wafers in a reactor. The wafers are loaded on a batch susceptor and the batch susceptor is positioned in the reactor such that a tapered gas flow space is created between the susceptor and an interior wall of the reactor. Reactant gas is then directed into the tapered gas space and over each wafer thereby improving deposition uniformity across each wafer and from wafer to wafer.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description be within the scope of the claims.

BRIEF DESCRIPTION OF THE DRAWINGS

The features, nature, and advantages of the disclosed subject matter may become more apparent from the detailed description set forth below when taken in conjunction with the drawings in which like reference numerals indicate like features and wherein.

DETAILED DESCRIPTION

Although the present disclosure is described with reference to specific embodiments, such as monocrystalline silicon and depletion-mode epitaxial deposition reactors, one skilled in the art could apply the principles discussed herein to other areas and/or embodiments without undue experimentation.

The present application discloses high-productivity depletion mode reactor (DMR) designs and manufacturing methods providing high-productivity, low-cost-of-ownership (low COO) batch wafer epitaxial deposition. The tools provided may utilize gas precursors such as trichlorosilane (TCS) in hydrogen ($H_2$) for epitaxial silicon deposition or other precursors known in the art.

Further, the present disclosure references a "wafer" which may be viewed as equivalent to a work piece, semiconductor substrate, substrate, or template upon which the epitaxial deposition occurs. In one embodiment of the present disclosure, the wafer, after epitaxy, may be used repeatedly as a reusable template to grow and release crystalline wafers. The use to which the work piece or wafer is put to after epitaxial deposition is beyond the scope of the present disclosure: one of ordinary skill will recognize the myriad uses to which the wafer might be put without departing from the spirit of the present disclosure.

One novel aspect of the reactor of the present disclosure lies in the arrangement of the wafer susceptors (a susceptor is a material used for its ability to absorb electromagnetic energy, such as optical energy, and impart that energy, in the form of heat or thermal energy, to the wafers). Although the susceptors may be heated electromagnetically such as with inductive heating coils, optical heating lamps such as tungsten-halogen lamps or resistive heating can also be effective. Some preferred embodiments may use either optical heating lamps such as tungsten halogen lamps or inductive heating coils, with lamp heating being the most preferred.

The susceptors of the present disclosure may be stackable to provide very high productivity, yet they do not rely on stacking for providing the "building blocks" of the overall reactor. The reactors of the present disclosure may or may not be depletion mode reactors (DMRs). "Depletion mode" (DM) refers to the depletion or utilization of chemical along the direction of gas flow in order to achieve a relatively high precursor and gas utilization rate.

The disclosed subject matter addresses some of the current hurdles to the implementation of high productivity epitaxial deposition systems, mainly by providing leverage through uniformity and gas utilization improvement together with teaching an economic path for learning and adjusting complex deposition processes and equipment in order to minimize necessary learning cycles. The designs and methods include parallel usage of common handling systems for efficient and automated wafer transport.

Figure 1:
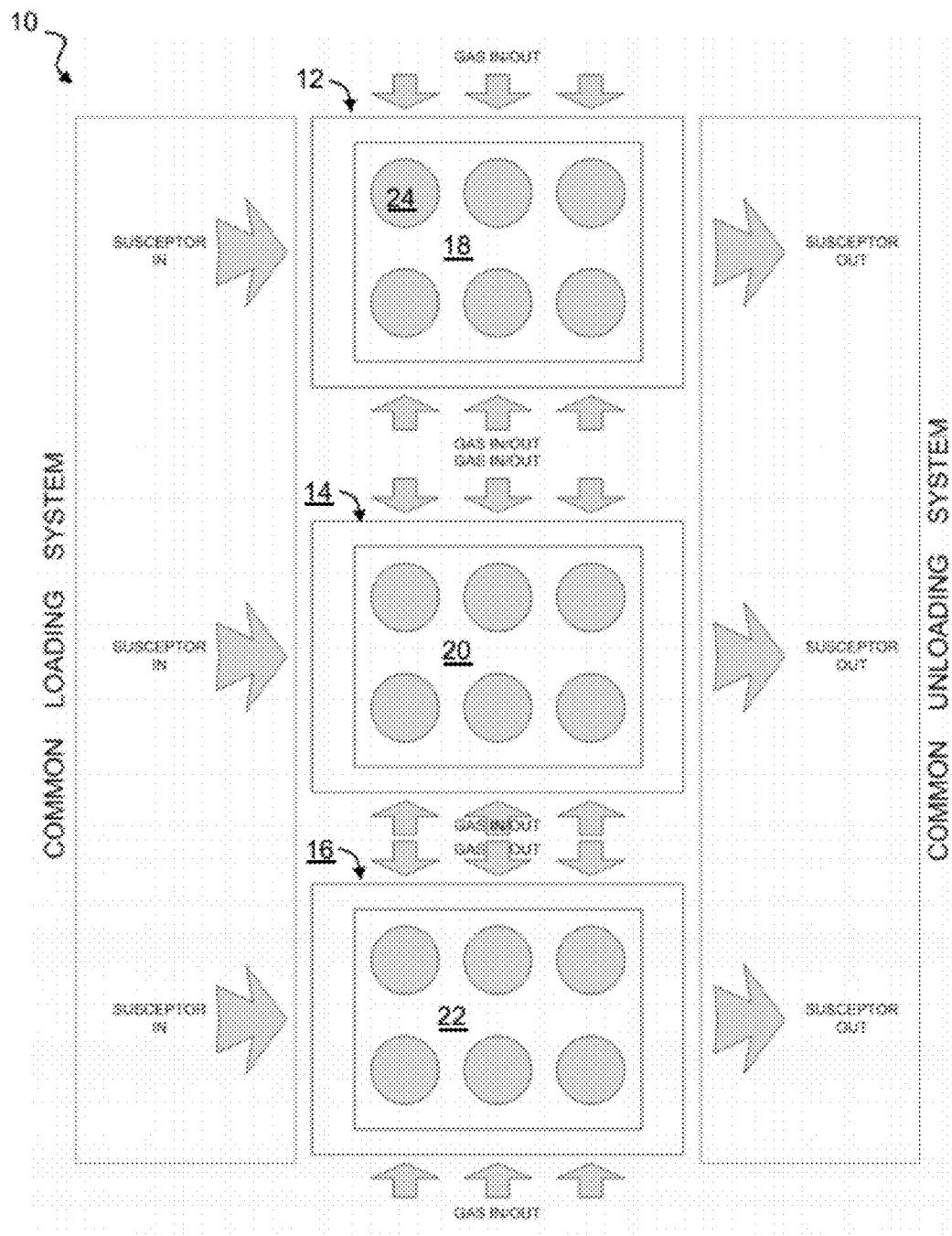
FIG. 1 is a diagram depicting a top view of a parallel independent depletion-mode epitaxial tool.

FIG. 1 is a top view of a depiction of a design of a parallel independent depletion mode epitaxial growth tool in accordance with the disclosed subject matter. Tool 10 comprises three independent chambers 12, 14, and 16 (the number of chambers is scalable and may be less or more depending on the throughput requirements) with common susceptor loading and unloading systems (automation). Each chamber is capable of growing silicon (or other semiconductors through epitaxial deposition using CVD or MOCVD) epitaxial layers (intrinsic or doped) on a silicon (or other crystalline semiconductors including but not limited to alloys of silicon with germanium and/or carbon) substrate introduced to the reactor chamber on a 2×3 susceptor, shown as susceptors 18, 20, and 22—importantly the susceptors may have other designs such as 4×6, 2×4, etc. The semiconductor wafers, such as wafer 24, loaded onto the susceptor may be, although shown in FIG. 1 as round, square-shaped, pseudo square shaped, or rectangular shaped to minimize parasitic deposition on the susceptor and to maximize precursor utilization. Shown, the gas direction flows from gas input to gas output and is preferably perpendicular to the longest side of the susceptor. The reactant gas is introduced through the gas input, flows over and covers the wafers, and is exhausted through the gas output. Importantly this gas direction is reversible and switchable—half of the gas flows in one direction and the other half flows in the opposite direction. The gas flow direction may be modulated and alternated once or multiple times during each deposition run (epitaxial deposition). Further, the design of FIG. 1 may accommodate a susceptor or wafer holder window-frame arrangement to allow for dual sided deposition.

A novel design of the present disclosure is a parallel and independent chamber system (relative to a serial chamber tool). This design, as depicted in FIG. 1, provides numerous advantages over existing epitaxial growth tools, including: 1) wafers are stationary during each run (epitaxial deposition) in a given chamber and are subject to only one temperature cycle (compared to multiple heat-cool cycles on serial system), thus, reducing the risk of excessive thermal stress and slip formation; 2) the wafer transport system may be greatly simplified; 3) maintenance accessibility is improved as each tool is independently accessible; 4) tool availability is not impacted by one chamber going down as the other chambers can operate independently of each other; 5) tool design is highly scalable (the building unit is one chamber) based on replication of a common batch process chamber; 6) it is easier to stagger or time modulate the operation of the chambers for efficient power and fab utilities management; 7) depositing thin epi films is easier and more controllable as each chamber is independently operable; 8) chamber design is simplified leading to a decrease in tool complexity and problems thus inherently improving reliability; and 9) the tool design has no moving parts that may create particles—no motion during the deposition cycle improves the quality of the deposited film as particle impurities may degrade film performance.

Figure 2:
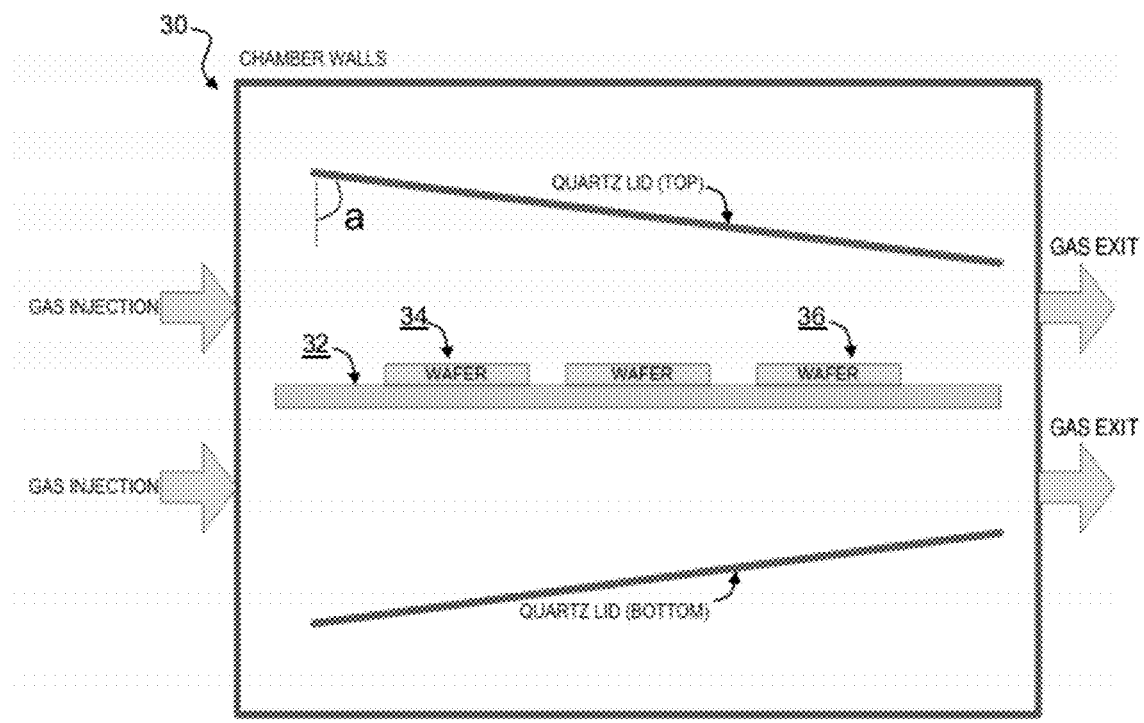
FIG. 2 is a side view of a depiction of a depletion mode chamber with tapered quartz lids.

Typical depletion-mode reactors use a bi-directional gas injection system, such as the reactor shown in FIG. 1, which reverses the flow of gas from one side of the chamber to the other to compensate for the reactant's depletion in order to provide uniform deposition across the wafers. An alternative method of compensating for the reactant's depletion and providing uniform deposition across each wafer and across multiple wafers is by tapering the space between the wafers and the quartz lid in the chamber in the direction of the gas flow. This tapering will increase the gas speed as the tapered gap is reduced which allows the remaining reactants to effectively reach the surfaces of the downstream wafers for uniform epitaxial deposition (i.e. suppresses boundary layer growth resulting in enhance deposition uniformity). FIG. 2 illustrates this tapering concept.

FIG. 2 is a side view of a depiction of a depletion mode chamber with tapered quartz lids. Chamber 30 comprises a sloped quartz lid top and a sloped quartz lid bottom which together form a tapered path for the reactant gas to pass through and over the wafers positioned on susceptor 32, optionally in a window frame shape to allow for dual side deposition of multiple wafers. This chamber design increases the gas velocity from wafer 34 to wafer 36 and, thus, compensates for the reactant's depletion as it flows through the chamber from wafer 34 to wafer 36. Note that interior chamber wall angle a formed between the quartz lid top and the chamber wall through which the gas flows and positioned perpendicular to the gas flow is an acute angle. The susceptor shown in FIG. 2 provides for dual sided wafer epitaxial deposition on both sides of the wafers and thus both the top and bottom quartz lids are sloped to increase gas flow—in the case of single-sided wafer epitaxial deposition, only one chamber wall would be required to be sloped to increase gas flow and thus decrease gas depletion.

Figure 3:
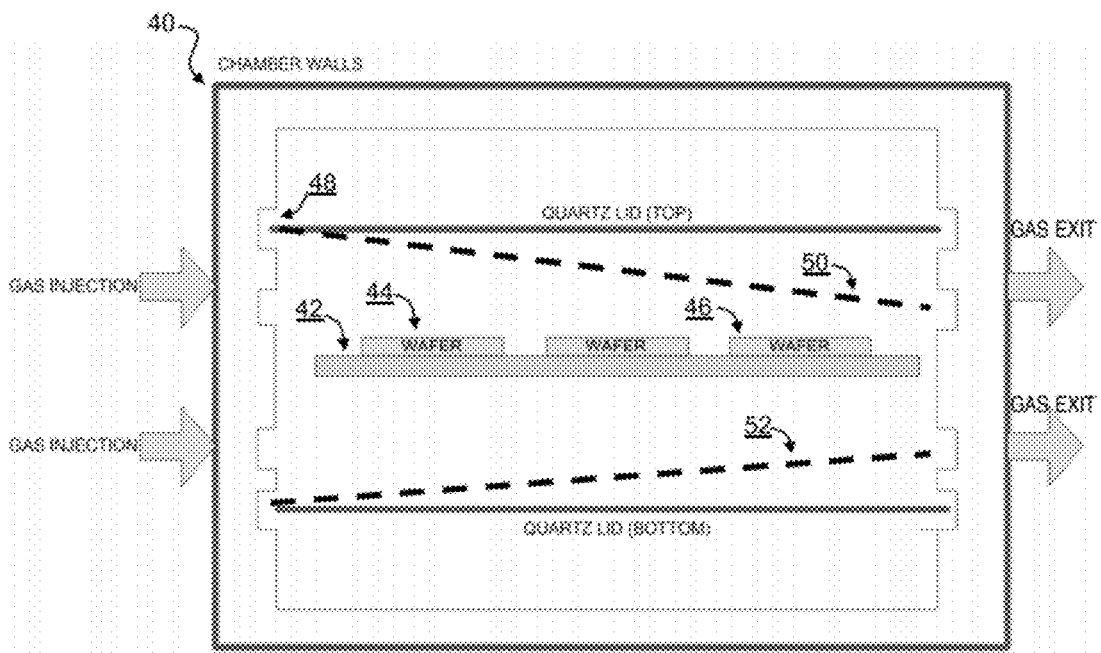
FIG. 3 is a side view of a depletion-mode chamber with a variable chamber volume.

The tapered flow design of FIG. 2 may also be combined with a dual direction gas flow. For instance, the chamber walls may accommodate the quartz lids at various distances from the wafers in order to vary the effect of chamber volume, gas speed, gas temperature, etc. on the epi growth. FIG. 3 depicts illustrates this concept.

FIG. 3 is a side view of a depletion-mode chamber with a variable chamber volume. Chamber 40 comprises a quartz lid top and a quartz lid bottom forming a space for the reactant gas to pass through and over the wafers positioned on susceptor 42, which optionally may have a window frame shape to allow for dual side deposition of multiple wafers. Both the quartz lid top and a quartz lid bottom have various shelving positions (for variable taper angle), such as shelving slot 48 which houses the quartz lid top shown in FIG. 3, into which the lid top or bottom may be positioned to create a sloped chamber wall (with an acute interior angle such as angle a shown in FIG. 2). This adjustment changes the chamber volume and/or forms a tapered space for the reactant gas to flow through the chamber, increases the gas velocity and thus eliminating and compensating for the detrimental impact of the reactant's depletion on deposition uniformity as it flows from wafer 44 to wafer 46. Two quartz lid position possibilities are shown in FIG. 3 as optional quartz lid top position 50 and optional quartz lid bottom position 52 to illustrate alternative quartz lid geometry arrangements, by utilizing the chamber shelves, which may be used to slope a chamber wall and thus taper and/or adjust the chamber volume in order to modify epitaxial growth on the wafer.

Figure 4:
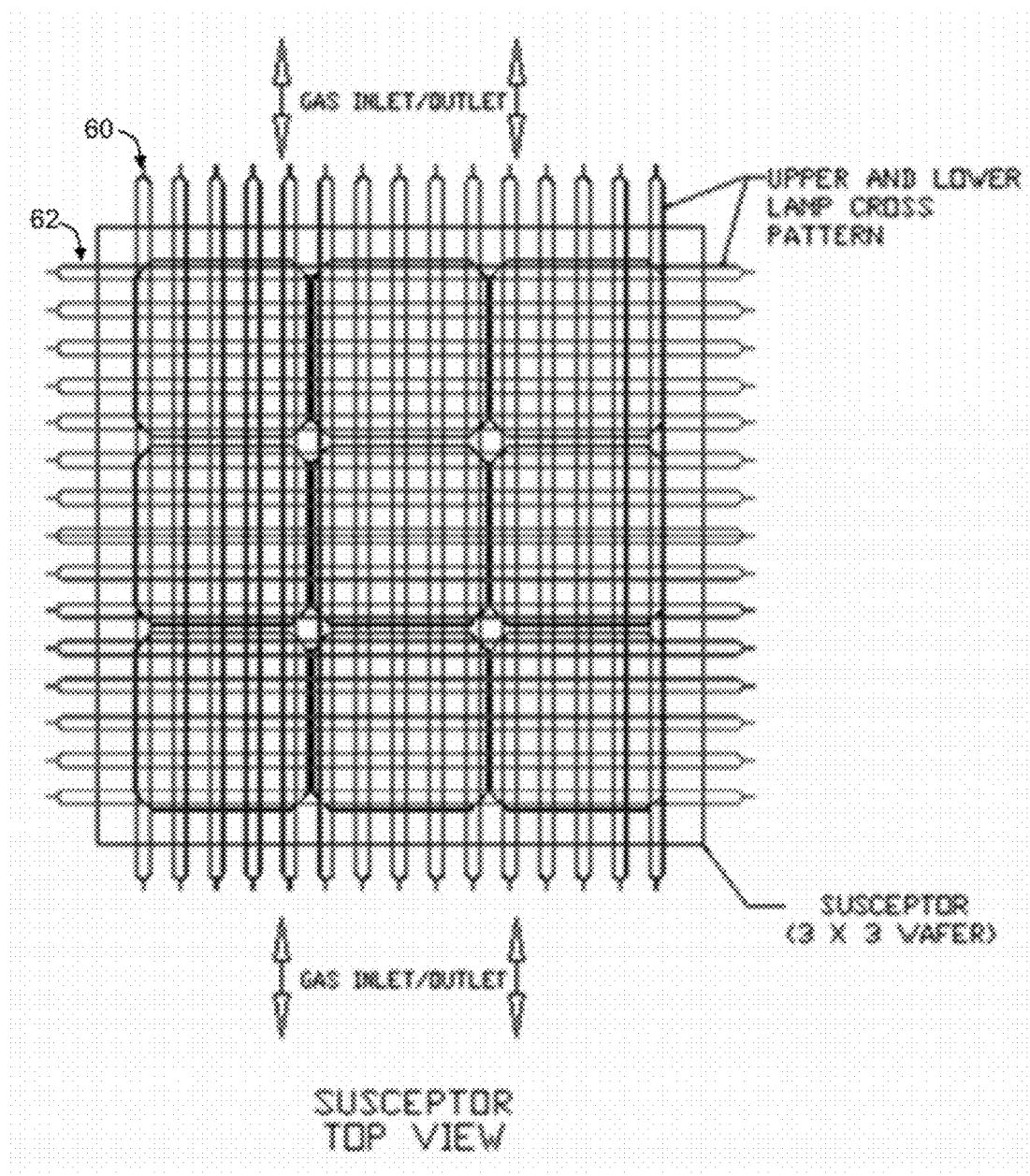
FIG. 4 is a top view of a depiction of a depletion-mode chamber highlighting both top and bottom (above and below the wafer) heating lamps in a cross pattern.

During dual side deposition, the wafer may be exposed to the heat source on both sides. Because of the thin nature of wafers, achieving heat source and wafer temperature uniformity is paramount. Arranging the heat lamps in a cross or staggered pattern will facilitate uniform heat across the wafer. FIG. 4 is a top view of a depiction of a batch depletion-mode chamber highlighting both a top and bottom (above and below the wafer) lamp in a cross pattern. As shown in this embodiment, upper lamp pattern 60 is positioned above the wafer and susceptor in a vertical row pattern and lower lamp pattern 62 is positioned below the wafer and window frame shaped susceptor to allow for the dual side deposition of multiple wafers. Alternative patterns of upper and lower lamps include a parallel pattern (the upper and lower lamps aligned in the same direction), and a staggered parallel pattern (the upper and lower lamps aligned in the same direction and staggered by a half pitch).

Figure 5A:
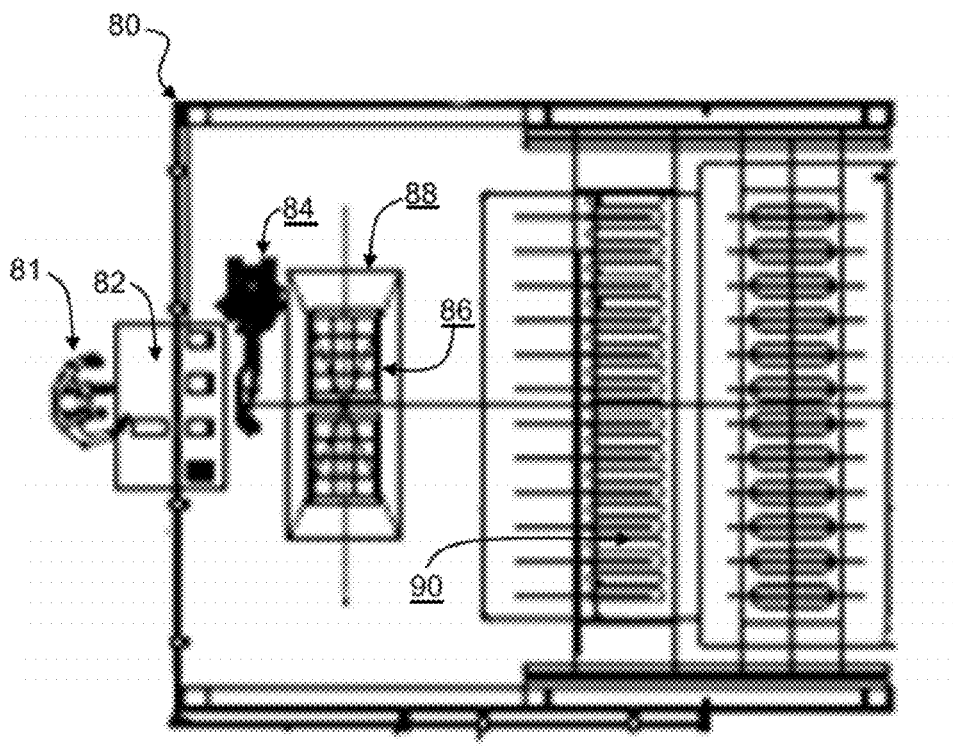
FIGS. 5 and 6 depict an automated handling system for loading and unloading the wafers into and out of susceptors and for loading and unloading the susceptors, carrying the wafers, into a series of parallel-architecture reactors.
Figure 5B:
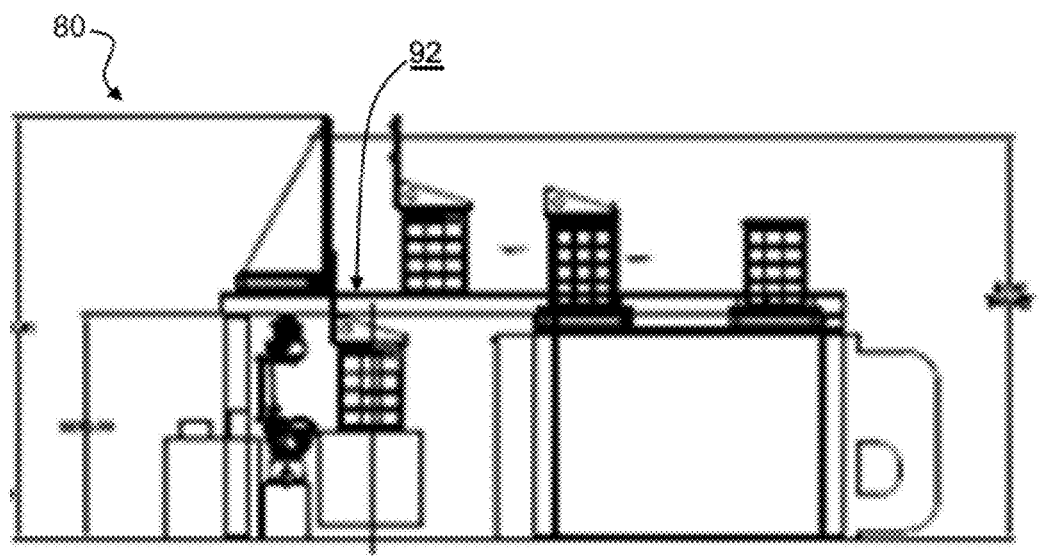
Figure 6:
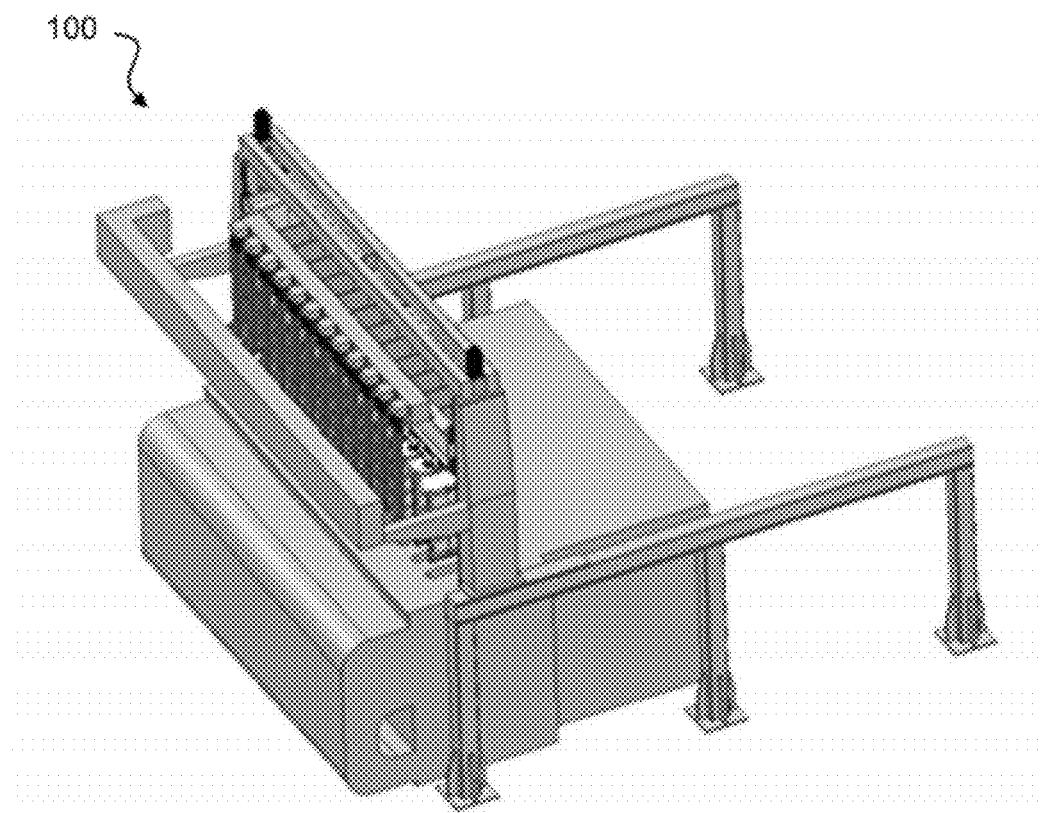

FIGS. 5 and 6 depict a system for loading and unloading the wafers into and out of susceptors and for loading and unloading the susceptors, carrying the wafers, into a series of parallel-architecture reactors.

FIGS. 5A and 5B are schematics, a top and side view respectively, of automation system 80. Twelve parallel reactors are deployed as an example in FIG. 5 but the number of reactors may vary and should be balanced by the throughput of the automation system for cost efficiency or other factors such as space considerations.

Wafer carrier 82, for example cassettes, are loaded into the automation system by operator 81, or other means. Robot 84, removes the wafers directly from wafer carrier 82, or as it is often customary from a conveyor belt attached to the wafer carrier station, and places the wafers onto wafer pockets of susceptor set 86. Susceptor set 86 comprises a left and right susceptor. The left and right susceptors when mated will form a channel with the top and bottom sides of the mated pair open for the purpose of gas flow.

After all pockets of the susceptor set 86 are loaded with new wafers, folding table 88 will close the susceptor set, by mating the right and left susceptors, forming a channel with wafers covering inside surfaces of the joined assembly. Then, overhead gantry 92 will load the loaded susceptor onto susceptor carrying tray 90. Carrying tray 90 may have space for any number of susceptors, including double the number of process reactors in this case 24, spaced at intervals equal to one half of the spacing between the reactors.

After the first susceptor is loaded onto the tray, gantry 90 will move another susceptor set onto folding table 88 and the susceptor set is then opened and the process of loading wafers from the wafer carriers onto the second susceptor set is repeated as described above. After all the susceptors are loaded, tray 90 moves to the susceptor loading position directly above the reactors.

Then, a separate vertical-motion gantry, such as vertical-motion gantry 100 shown in FIG. 6, lifts the entire sets of susceptors from tray 90 and the tray moves back to clear the path for susceptor loading into the reactors. The vertical motion gantry, such as the example gantry shown in FIG. 6, then loads the susceptors into the reactors and the process of epitaxial deposition begins.

While the deposition process is in progress, robot 84, folding table 88, and gantry 92 continue to load another set of susceptors with new wafers so that after the deposition process is completed the vertical gantry may lift the previous set of susceptors containing the processed wafers with deposited film from the reactors and exchange them with a new set of wafers ready for deposition. To facilitate the exchange, tray 90 or the vertical gantry may have a horizontal motion equal to one half of the spacing between the reactors.

Figure 7A:
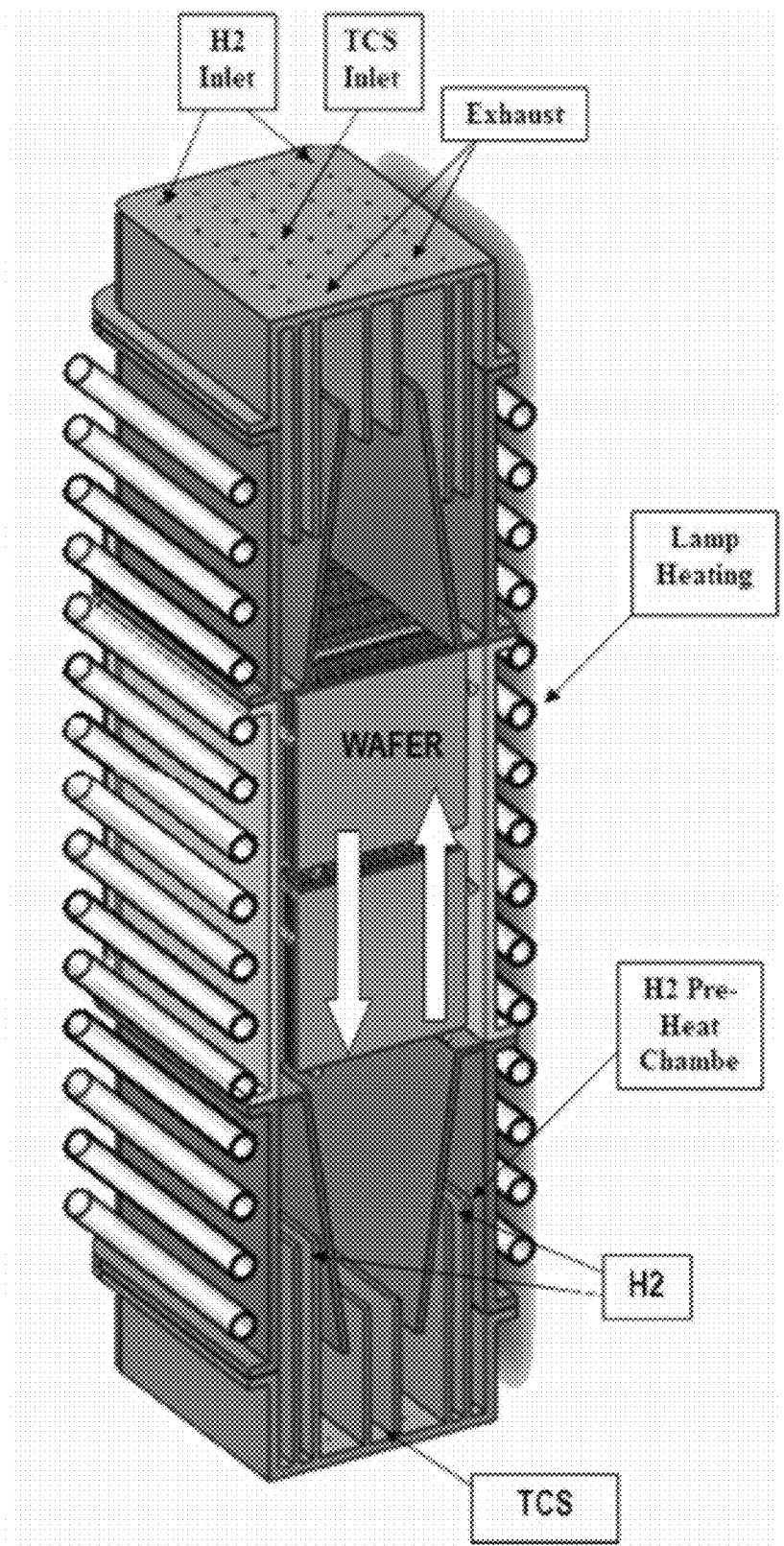
FIGS. 7A, 7B, and 7C are cross sectional depictions of a Batch Depletion-Mode Reactor (BDMR) chamber in accordance with the disclosed subject matter.
Figure 7B:
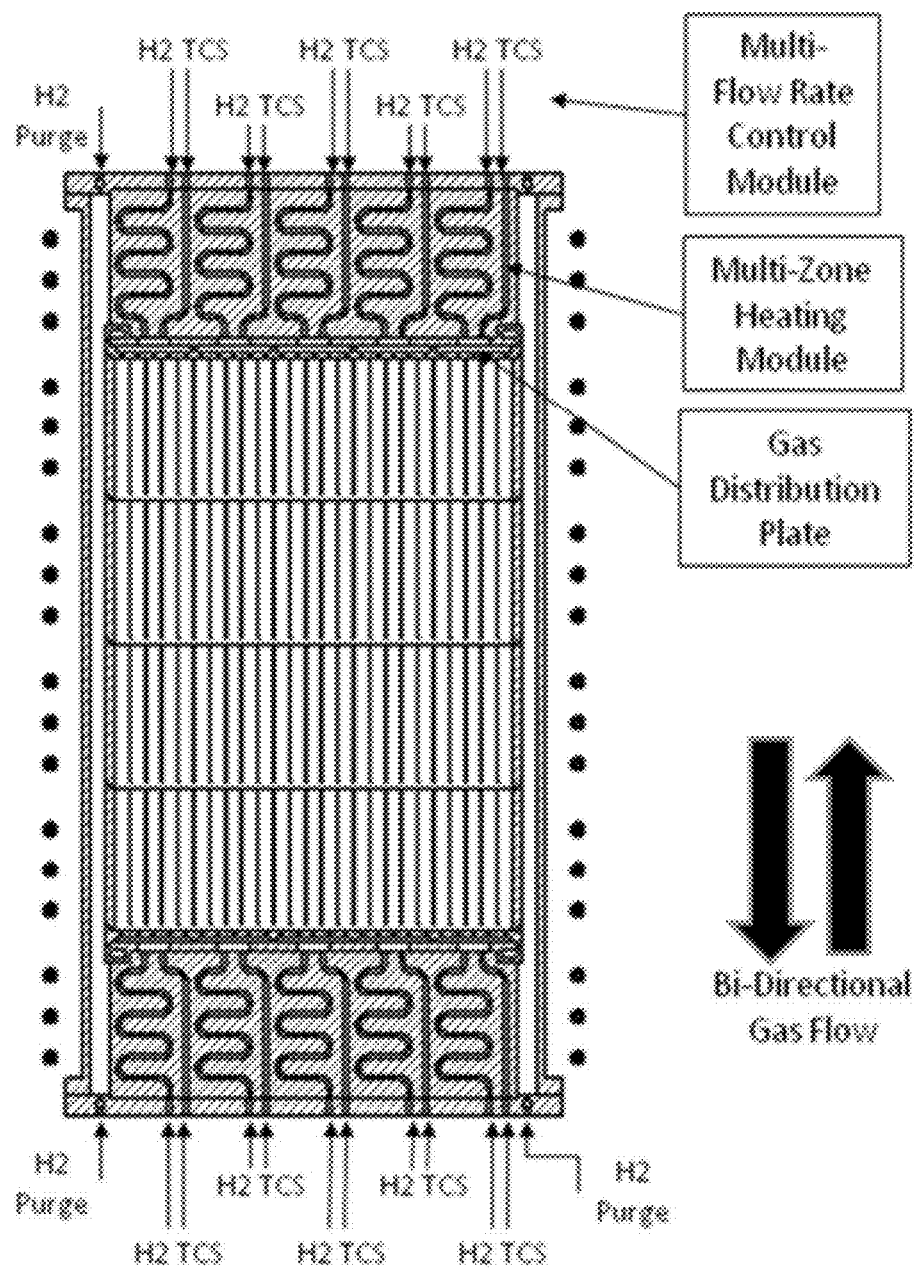
Figure 7C:
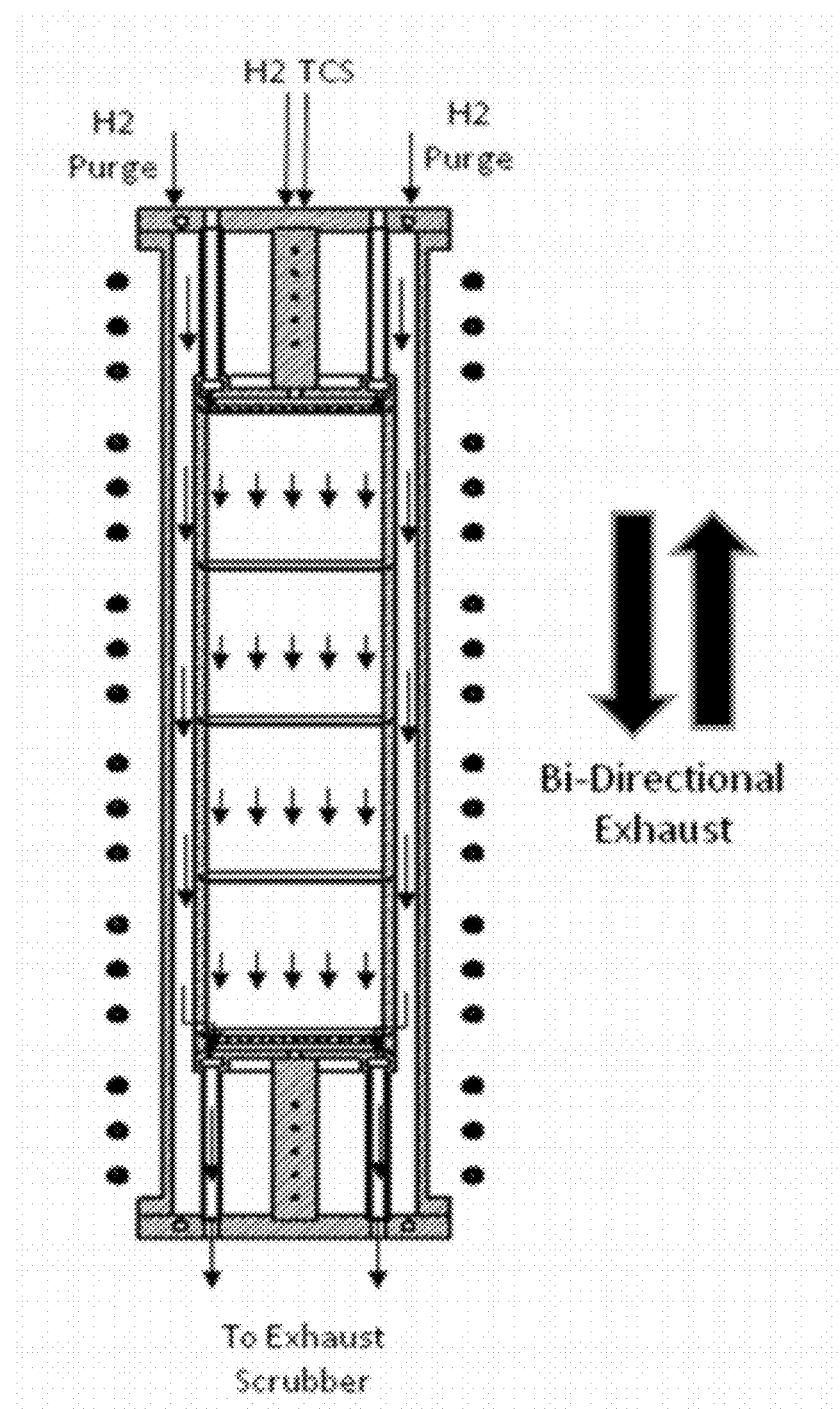

FIGS. 7A, 7B, and 7C are cross sectional depictions of a Batch Depletion Mode Reactor (BDMR) chamber in accordance with the disclosed subject matter. FIG. 7A is an angled side view, FIG. 7B is a front view, and FIG. 7C is a side view of the BDMR chamber. This reactor is designed for high packing density, dual-side deposition, and low parasitic deposition while maintaining very high throughput. This design may also support a parallel architecture susceptor. Lamp heating enables rapid thermal cycles for heating and cooling, although the disclosed subject matter is not limited to lamp heating and may be adapted to other heating mechanisms such as inductive electrical energy (RF or AC) coupling into susceptors or directly into silicon—heating methods commonly used in such applications. It may also be possible to use high frequency electromagnetic energy coupling, with waves in the megahertz or gigahertz range, as a coupling mechanism for the batch heating of wafers for deposition reactors.

And the use of highly doped silicon wafers enables two beneficial effects: firstly, the ease of formation of porous layer or layers and secondly, an improved thermal coupling depending on the heat source, due to higher electrical conductivity of such wafers over starting (less highly doped) wafers. As an example, wafers may have resistivities in the range of 0.01 to 0.02 ohmcm ($\Omega \cdot cm$); however other ranges may be utilized. Alternatively, the design supports single side deposition with wafers loaded back to back or with the use of a wafer susceptor plate.

A process cycle includes the heating of wafers and chamber internals, followed by deposition of epitaxial silicon film while desired process temperature is maintained, and then the cooling of wafers and chamber internals to an acceptable temperature for unloading. Depending on the desired thickness of semiconductor layer (from a fraction of one micron up to 10's of microns), the process cycle may range from about several minutes to several hours (with the preferred process cycle time being no longer than about 1 hour). As shown in FIGS. 7A, 7B, and 7C, gas input and exhaust in the proposed chamber are reversible thereby enabling uniform deposition and dopant uniformity by switching the gas flow and exhaust direction at least once during the deposition process. During flow reversal, a minimal amount of $H_2$ is released through each port on the input plenum to preserve cleanliness integrity. Side lamps, such as those shown in FIGS. 7A, 7B, and 7C, facilitate thermal uniformity around the reactor body. Gas switching may also be used multiple times during a deposition cycle to allow for doping and/or bandgap modulation of the semiconductor lauer during the deposition process.

A key aspect of this example reactor is that hydrogen and TCS (or other silicon gas such as silicon tetrachloride) precursors may be separately heated via an inlet plenum/baffle arrangement. In this case, hydrogen can be preferably pre-heated to range on the order of deposition temperature, or more preferably to temperatures somewhat above the required wafer temperature for epitaxial deposition, so that after precursor gasses are mixed the equilibrium temperature of the mixture is close to the desired epi temperature. This may substantially eliminate any gas-loading-induced substrate cooling, slip dislocations, and deposition non-uniformities. The disclosed methods and systems provide sufficient heating areas or passages which may be utilized to heat the hydrogen gas without any deposition. As a result, the heating of large gas flow rates for a large number of wafers in high volume production may be achieved without increasing parasitic deposition. A small mixing area, seen in FIGS. 7B and 12, between the outlet of the gas plenum and entrance to deposition chamber, may be used to ensure proper gas mixing. This mixing area should preferably be minimized in order to reduce parasitic deposition.

Figure 8:
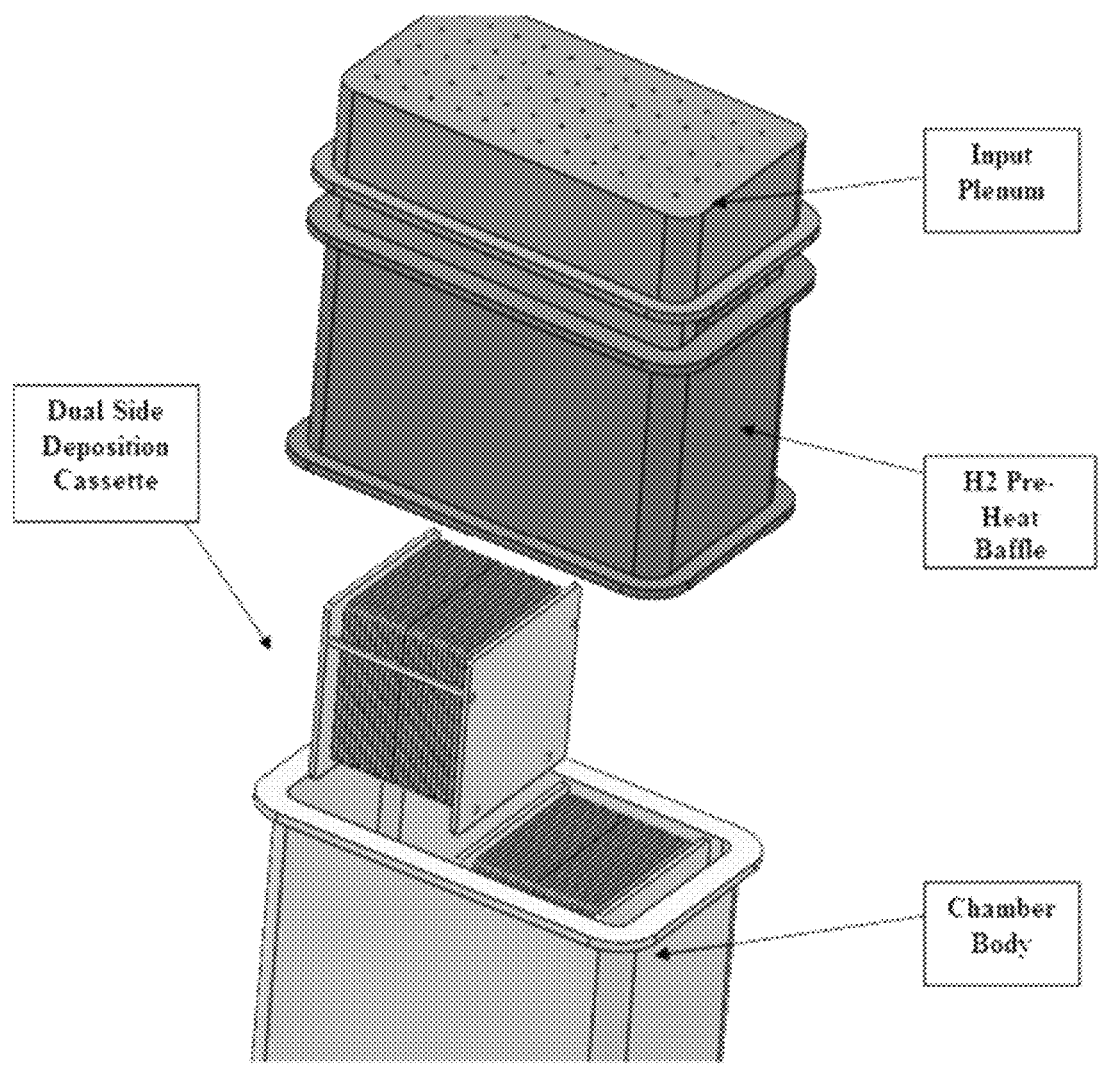
FIG. 8 is a diagram showing an exploded view of the BDMR chamber of FIG. 7 and a dual sided cassette for carrying wafers.

FIG. 8 is a diagram showing an exploded view of the BDMR chamber of FIG. 7 and a dual sided cassette for carrying wafers. The wafers, which may be preferably square or pseudo square shaped, are held within the dual side cassettes. The number of wafers in each cassette may range from about 10 to 50 (although the batch size per cassette may be larger than 50). And as shown in FIG. 7, a number of cassettes may be stacked above each other to form a continuous channel for epi gas flow. The number of cassettes vertically stacked and loaded per deposition chamber may preferably range from 1 to 10 for optimum gas utilization and throughput.

The example BDMR chamber shown in FIG. 7, may also be deployed in a multi-chamber system. Multi-chamber systems may reduce overall footprint as well as total tool cost compared to single chamber tools. Multi-chamber systems of the disclosed BDMR design, and those contemplated by the disclosed designs, may also provide better usage efficiency of heating power as the heat sources may be partially shared between chambers by arranging chambers closely together. However, one complication with having many chambers in a multi-chamber tool is the total amount of electrical power required, especially because the power for process heating, e.g. lamps, must be shut on and off for every process cycle. Cycling the lamp powers on and off can create significant electrical power sag or surge in the plant when the total power is in hundreds of kilowatts to megawatts. A solution provided to eliminate power sags and surges is to turn the lamps for various chambers (and/or for various multi-chamber reactors within a single plant) on or off sequentially with suitable time delays (staggered start/stop of lamps for various chambers). Such time delays or staggering of the heat-up starts may range from few seconds to several minutes to accommodate smooth electrical loading and to reduce the peak electrical power requirement. For instance, if a factory uses several (for example 10) multi-chamber epitaxial reactors (for example each reactor having 10 to 12 chambers), while the lamps for the chambers in any multi-chamber reactor are concurrently ramped up in power when the process starts, the process startup (or power ramp up) among various reactors may be properly staggered based on the disclosed sequential start up solution in order to substantially reduce the peak electrical power required in the factory. This reduction in peak electrical power occurs because the peak electrical power required for the susceptor and wafer temperature ramp up during process startup in each chamber is substantially larger than the steady-state or average power required to sustain the wafer temperature at the process temperature. Thus, a significant cost reduction can be achieved for the high-volume epitaxial semiconductor deposition processes using the reactors and methods of this invention.

Such staged usage of electrical peak power may be accomplished, for example, through the use of sensors and/or factory control schedulers that control the operation cycles of the reactors within a fabrication environment. Such scheduling may cooperate with a cost-effective substrate and/or susceptor handling automated system if common automation robotics is used to load and unload several reactors. In such cases, the automation may, for example, load or unload one reactor while another reactor is ramping up temperature and other start up processes.

Figure 9:
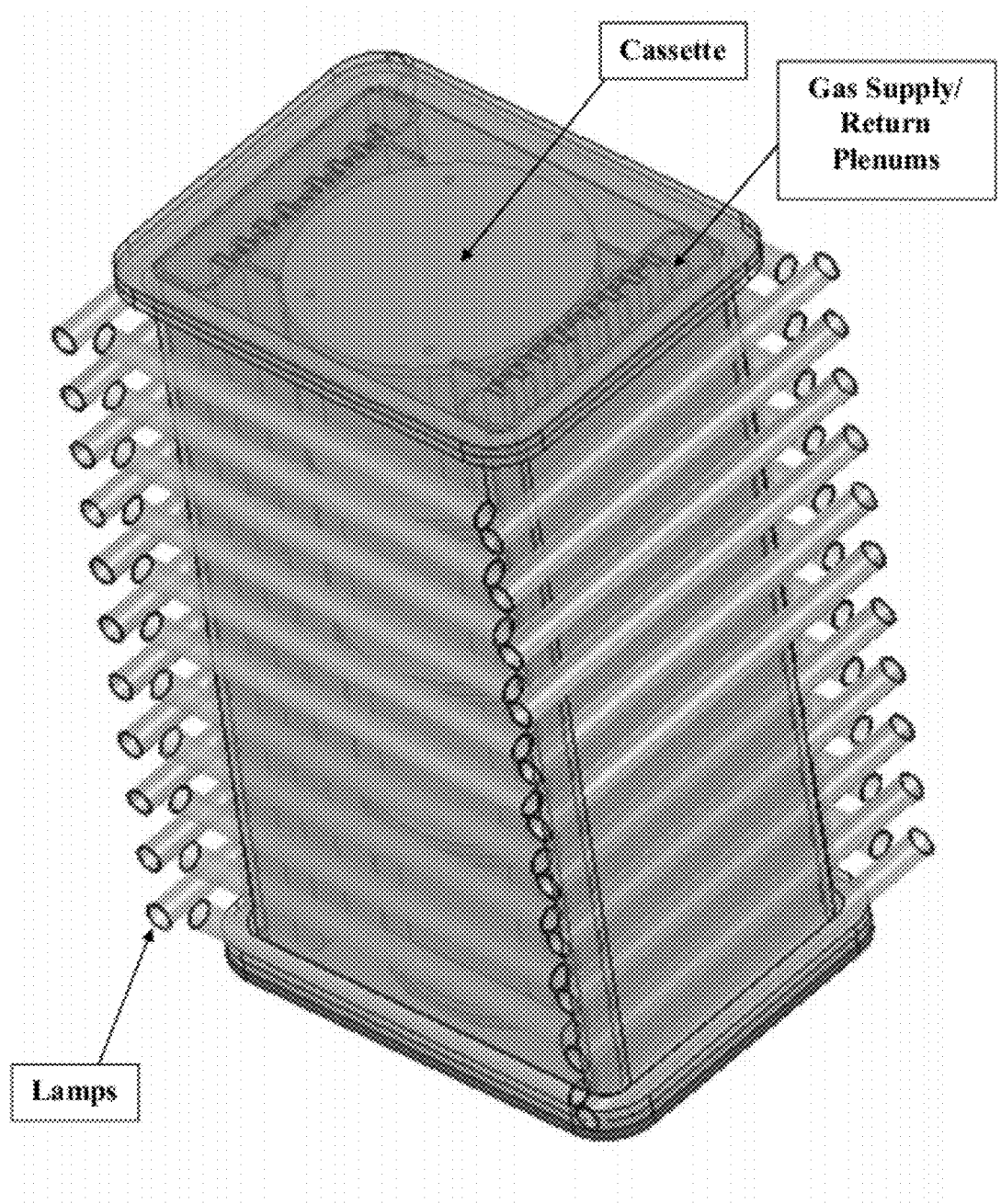
FIG. 9 is an isometric view of a variation of a BDMR herein be referred to as a Batch Stack Reactor (BSR)/Depletion Mode Reactor (DMR) chamber.

FIG. 9 is an isometric view of a variation of a BDMR herein be referred to as a Batch Stack Reactor (BSR)/Depletion Mode Reactor (DMR) chamber. In this embodiment, the wafers are arranged in a horizontal cassette "stack." A benefit of such a stack arrangement is the large capacity (or packing density) and hence capital productivity. Supporting wafers in a cassette susceptor, with minimal contact, significantly increases the ratio of wafer area to susceptor area thereby reducing parasitic deposition.

Figure 12:
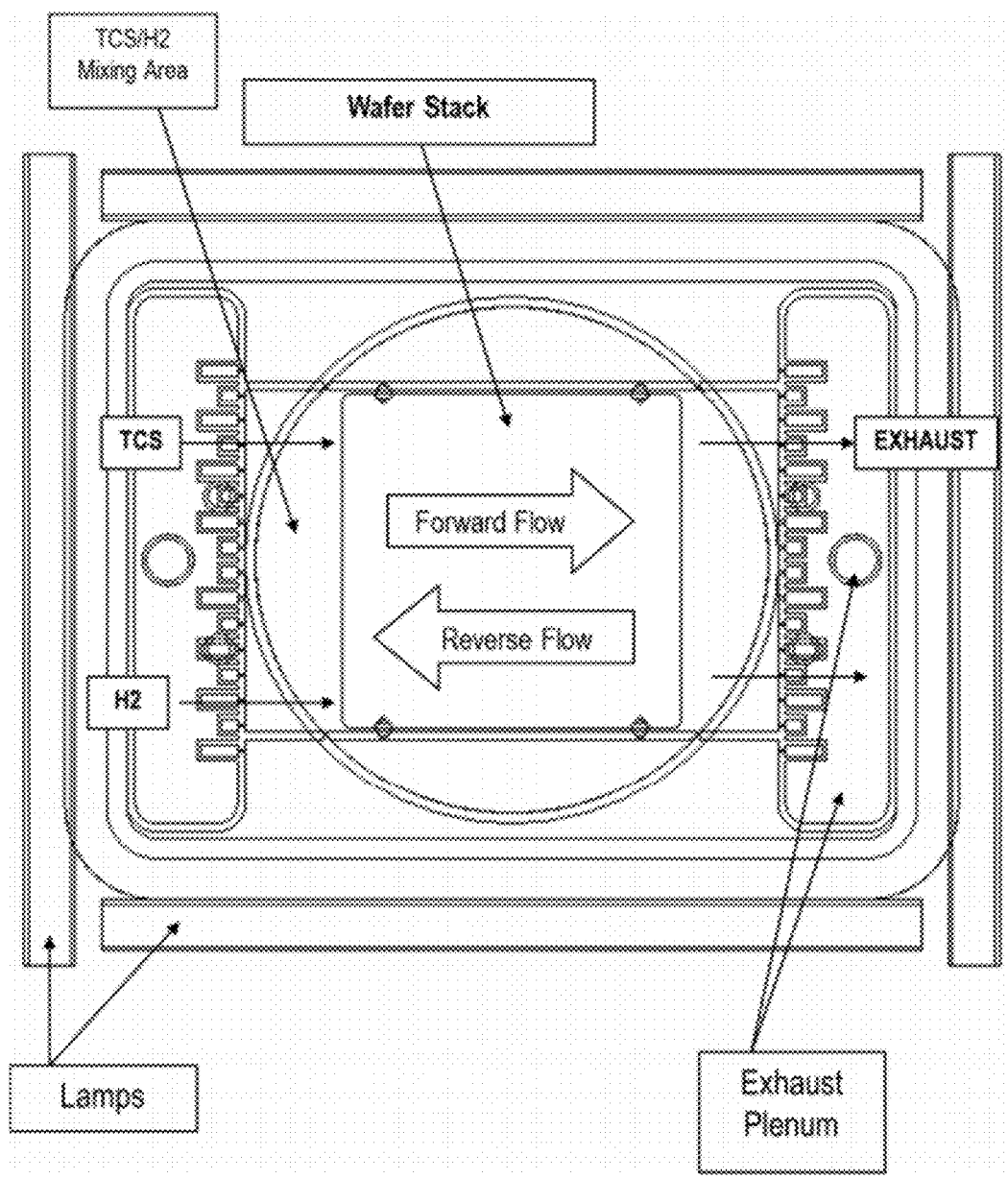
FIG. 12 is cross sectional depiction of a BSR/DMR with a bi-directional gas flow.
Figure 13:
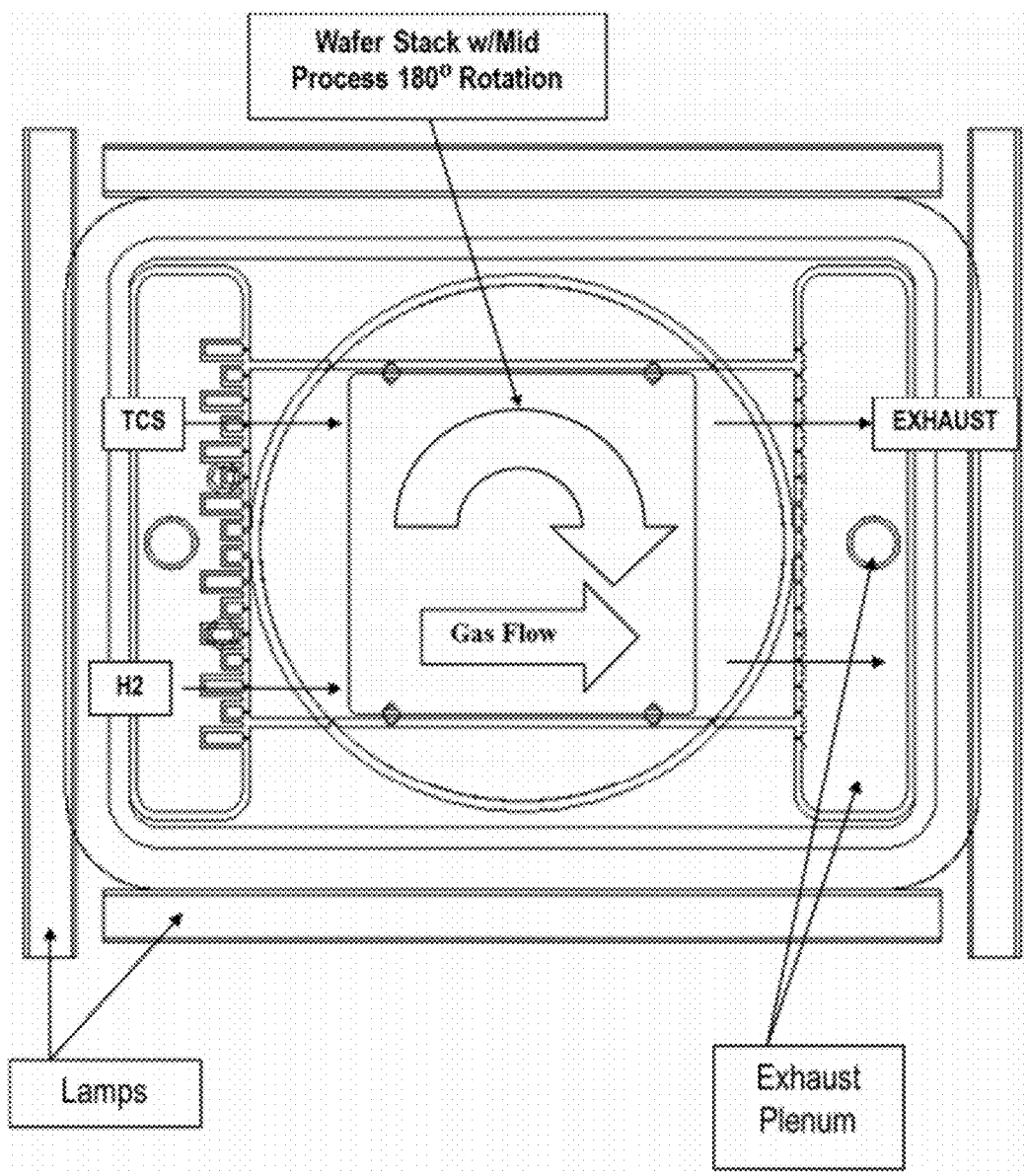
FIG. 13 is a cross sectional depiction of a BSR/DMR with one direction gas flow and a 180 degree wafer stack rotation.

FIG. 12 is cross sectional depiction of a BSR/DMR with a bi-directional gas flow and FIG. 13 is a cross sectional depiction of a BSR/DMR with one direction gas flow and a 180 degree wafer stack rotation. The process cycle for the BSR/DMR reactor is similar to that of the BDMR in that approximately half way through the deposition cycle, the gas flow may reversed (shown in the embodiment in FIG. 13), assuming a single gas switching cycle occurs during the deposition process. Process recipe flexibility also allows for switching the direction of gas flow multiple times during a deposition cycle. Alternatively, in a slightly different embodiment (shown in FIG. 14), the Batch Stack is rotated or indexed 180 degrees. In either case, the result is uniform thickness across the wafer; however, the 180 degree rotation greatly simplifies the chamber design and accompanied plumbing system which reduces the equipment cost and complexity. Alternatively, rotation angles different from 180 degrees may also readily be used when desired and multiple rotation changes during a process are also possible. Further, it may also be advantageous to combine the rotation approach with gas flow reversal in a suitable equipment and process embodiment.

A small mixing area (shown FIG. 13) between the outlet of the gas plenum and entrance to deposition chamber may be assigned to ensure proper gas mixing. This mixing area may be minimized in order to reduce parasitic deposition.

Figure 10:
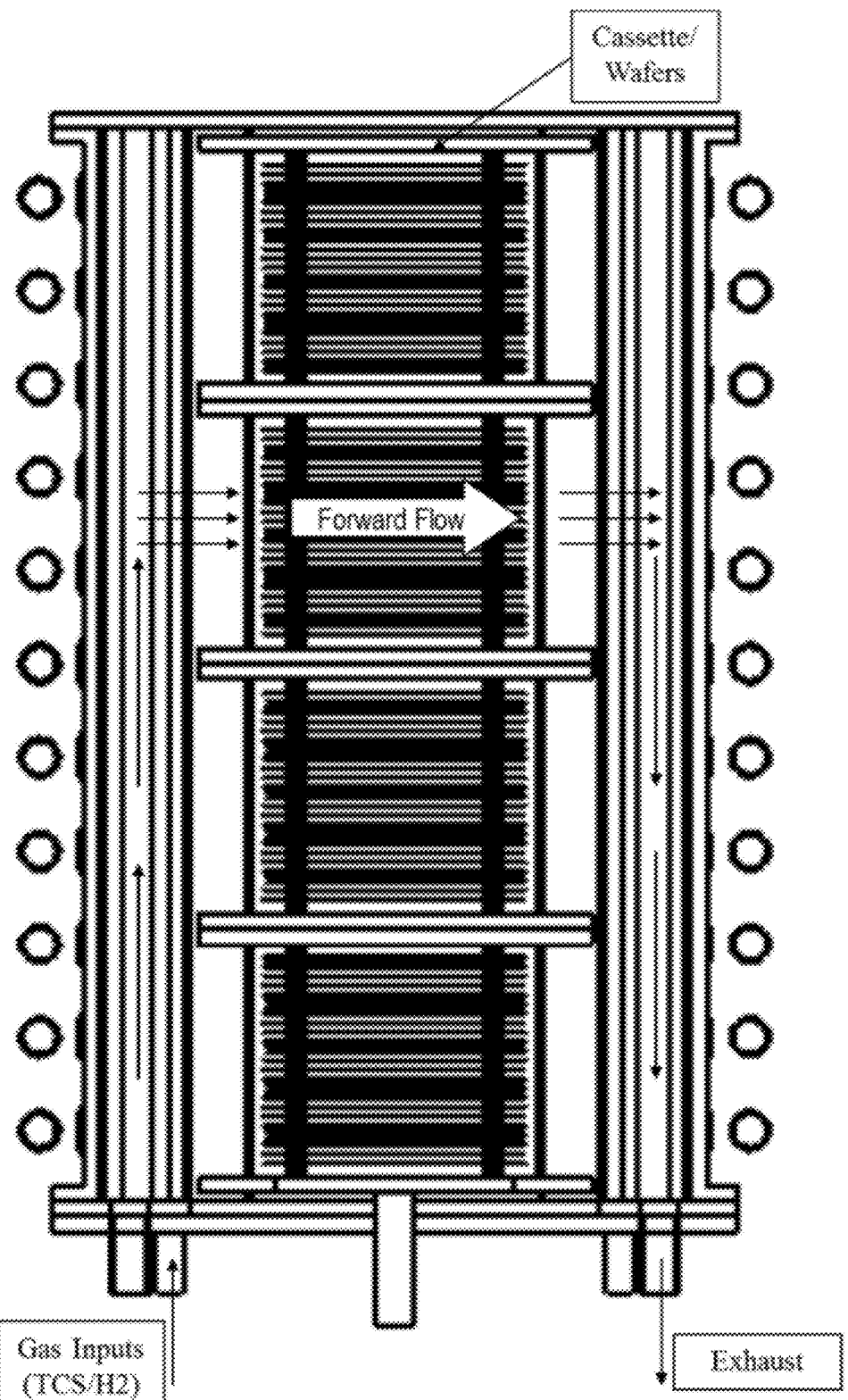
FIG. 10 is a cross section view of a BSR/DMR assembly showing a forward gas flow.

FIG. 10 is a cross section view of a BSR/DMR assembly showing a forward gas flow. As shown in FIG. 10, a number of cassettes may be stacked above each other to form a continuous channel for epi gas flow. The number of cassettes vertically stacked may range, for example, from 1 to 10 for optimum gas utilization and throughput. The proposed BSR/DMR chamber, shown in FIG. 9, may also be deployed in a multi-chamber system with the same advantages as described for the BDMR system.

Figure 11:
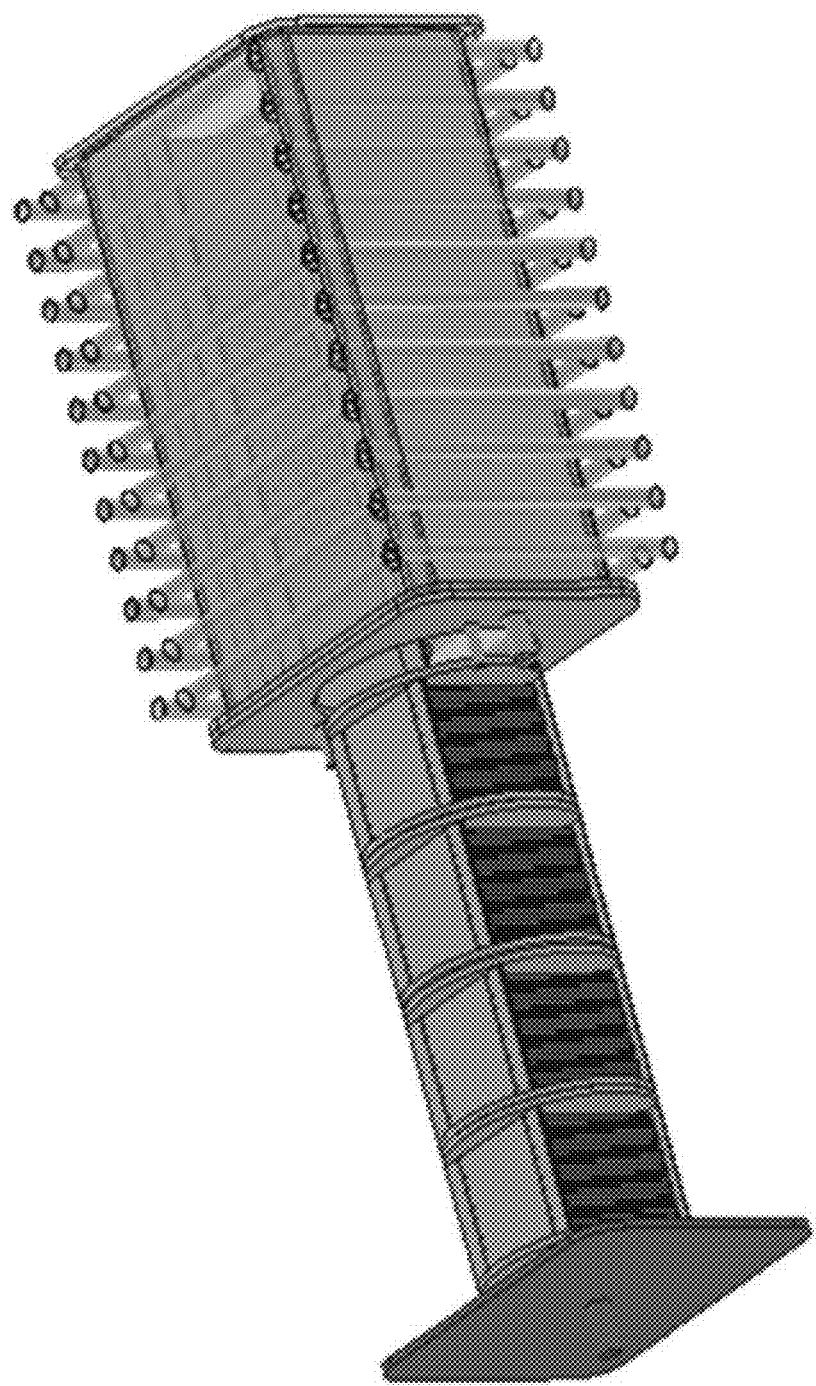
FIG. 11 is an isometric view of a BSR/DSR reactor assembly with the susceptors extracted.

FIG. 11 is an isometric view of a BSR/DSR reactor assembly with the susceptors extracted. Separating the wafer holders or susceptors into several cassettes, as illustrated in FIGS. 8 and 11, has several advantages which hold both for the BDMR as well as the BSR/DMR examples disclosed herein. First, automation for substrate loading and unloading may be optimized which leads to substantially improved utilization of the reactor. Wafers may be loaded and unloaded into and from said cassettes by one automation part so that by using exchange cassettes the loading and unloading of the reactor can proceed using full cassettes only. For example, if four cassettes are used, then during reactor operation four other cassettes with processed wafers may be unloaded and reloaded with unprocessed wafers while another batch with four cassettes is being processed concurrently. This concept of exchange cassettes also works for any number of cassettes including one active process cassette and one exchange cassette that is being unloaded and reloaded while the first cassette is in process. Secondly, cassettes or wafer holders/susceptors are typically expensive parts with a finite lifetime which contribute heavily to the cost-of-ownership (COO) of epitaxial deposition production processes. Silicon carbide coated graphite is a typical material for such high temperature capable cassette, and quartz, silicon and solid silicon carbide are also available materials. Smaller parts are typically cheaper to produce than single large and/or monolithic parts. Thus with suitable inspection, defective parts (such as those exhibiting pinholes in silicon carbide coatings or those with defects of the mechanical structure), may be exchanged without the need to exchange the whole large cassette or susceptor.

Sensors with optical detection, such as suitable cameras with absolute or comparative image processing may be implemented to identify and assist exchanging defective cassettes, susceptors, or cassette parts. Such cameras can be employed for instance during or after the unload cycle of a cassette. Further, one or more of the automation actuator components that actuates the motion of the cassettes in and out of the heating zone of the reactor or in and out of the wafer or cassette loading or unloading area to may also serve as a scan axis for inspection and detection of defects. Any such suitable inspection criteria may be employed to judge the need for a cassette or susceptor replacement.

In operation, the disclosed subject matter pertains to processing, including but not limited to deposition, of thin film materials in general, but more specifically to deposition of crystalline, including epitaxial monocrystalline silicon films (epi silicon films), for use in manufacturing of high efficiency solar photovoltaic cells as well as other semiconductor microelectronics and optoelectronics applications. Methods and production tools are conceived that allow fabrication of high quality single or dual-sided epi layers in large volumes. The proposed methods and equipment include new means of gas flow depletion compensation across a substrate, processing improvements, heating and channeling the flow of gaseous precursors, means for management of tool power, and ways to suitably precondition the wafer as part of the deposition tool.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A reactor for the dual sided deposition of thin-film semiconductor material layers in the approximate thickness range of less than 1 micron to 100 microns on two surfaces of a plurality of wafers carried on a batch susceptor, said batch susceptor having a window frame structure allowing access to said two surfaces of said plurality of wafers for dual sided deposition on said two surfaces of said plurality of wafers, said reactor comprising a gas flow chamber having a tapered gas flow space between an interior wall of said chamber and said susceptor to improve the deposition uniformity across each wafer and from wafer to wafer, a plurality of shelving slots for positioning said interior wall of said chamber in shelving positions, said deposition of thin film semiconductor material on a wafer is an epitaxial thin film monocrystalline silicon deposition and trichlorosilane is used as the precursor for thin film monocrystalline silicon deposition.

2. The reactor of claim 1, further comprising a cross heating lamp pattern.

3. The reactor of claim 1, further comprising a parallel heating lamp pattern.

4. The reactor of claim 1, further comprising a staggered parallel heating lamp pattern.

5. A reactor for the dual sided deposition of thin film semiconductor material layers in the approximate thickness range of less than 1 micron to 100 microns on two surfaces of a plurality of wafers carried on a batch susceptor, said batch susceptor having a window frame structure allowing access to said two surfaces of said plurality of wafers for dual sided deposition on said two surfaces of said plurality of wafers, said reactor comprising a plurality of adjustable shelves allowing for various positioning of said susceptor to create a tapered gas flow space between an interior wall formed by at least one of said adjustable shelves and said susceptor for reducing the depletion of gas flow across said wafer, wherein a plurality of shelving slots are configured for positioning said interior wall of said chamber in shelving positions, and wherein said deposition of thin film semiconductor material on a wafer is an epitaxial thin film monocrystalline silicon deposition and trichlorosilane is used as the precursor for thin film monocrystalline silicon deposition.

6. The reactor of claim 5, further comprising a cross heating lamp pattern.

7. The reactor of claim 5, further comprising a parallel heating lamp pattern.

8. The reactor of claim 5, further comprising a staggered parallel heating lamp pattern.

* * * * *